US006002627A

United States Patent [19]
Chevallier

[11] Patent Number: 6,002,627
[45] Date of Patent: Dec. 14, 1999

[54] INTEGRATED CIRCUIT WITH TEMPERATURE DETECTOR

[75] Inventor: Christophe J. Chevallier, Palo Alto, Calif.

[73] Assignee: Micron Technology, Inc., Boise, Id.

[21] Appl. No.: 09/237,484

[22] Filed: Jan. 26, 1999

Related U.S. Application Data

[63] Continuation of application No. 08/877,229, Jun. 17, 1997, Pat. No. 5,875,142.

[51] Int. Cl.$^6$ ....................................................... G11C 7/04
[52] U.S. Cl. ............................ 365/212; 365/211; 327/512; 327/513
[58] Field of Search .................................... 365/212, 211, 365/207; 327/138, 262, 378, 512, 513; 326/32

[56] References Cited

U.S. PATENT DOCUMENTS

| | | | |
|---|---|---|---|
| 4,716,551 | 12/1987 | Inagaki ..................... | 365/222 |
| 4,768,170 | 8/1988 | Hoff ........................ | 365/212 |
| 4,924,212 | 5/1990 | Fruhauf et al. ............ | 340/598 |
| 5,278,796 | 1/1994 | Tillinghast et al. ........ | 365/211 |
| 5,304,861 | 4/1994 | Fruhauf et al. ............ | 323/231 |
| 5,373,227 | 12/1994 | Keeth ....................... | 323/313 |
| 5,440,520 | 8/1995 | Schutz et al. .............. | 365/226 |
| 5,446,696 | 8/1995 | Ware et al. ................ | 365/222 |
| 5,451,892 | 9/1995 | Bailey ...................... | 327/113 |
| 5,563,760 | 10/1996 | Lowis et al. .............. | 361/103 |
| 5,581,206 | 12/1996 | Chevallier et al. ......... | 327/143 |
| 5,596,534 | 1/1997 | Manning .................. | 365/189.09 |
| 5,686,858 | 11/1997 | Malherbe ................. | 327/512 |

OTHER PUBLICATIONS

"Compact Flash 4—15 MB", 1997 *Flash Memory Data Book*, Micron Quantum Devices Inc. Boise, Idaho, 3–1 to 3–3, (1997).

"Flash Memory 2MEG × 8", 1997 *Flash Memory Data Book*, Micron Quantum Devices Inc. Boise, Idaho, 2–5 to 2–33, 1997.

*Primary Examiner*—Son Mai
*Attorney, Agent, or Firm*—Schwegman, Lundberg, Woessner & Kluth

[57] ABSTRACT

An integrated circuit is described which includes a temperature detection circuit. The detection circuit produces an output which indicates a temperature range of the integrate circuit. The output of the detection circuit is used to adjust the operation of the integrated circuit. The integrated circuit is described as a flash memory device which can include a controller to monitor the output of the detection circuit, or provide the output to an external controller. The controller uses the detection circuit output to adjust memory operation, such as operating frequency.

45 Claims, 5 Drawing Sheets

INTEGRATED CIRCUIT WITH TEMPERATURE DETECTOR

This application is a continuation of U.S. Ser. No. 08/877,229 filed Jun. 17, 1997.U.S. Pat. No. 5,875,142.

TECHNICAL FIELD OF THE INVENTION

The present invention relates generally to integrated circuits and in particular the present invention relates to temperature detection of integrated circuits.

BACKGROUND OF THE INVENTION

Most electronic devices are sensitive to changes in operating temperature. Devices incorporating integrated circuits such as portable computer and digital cameras are typically sensitive to temperature and will show variations in output due to variations in the temperature. The devices, therefore, are usually designed to avoid or decrease sensitivity to changes in the operating temperature. To achieve this result, the device circuitry becomes more complex.

Temperature sensors can be provided in these devices. The sensors, however, are typically an analog integrated circuit which cannot easily be implemented in an application specific integrated circuit ASIC or logic design. Thus, to provide a sensor in a device, an extra integrated circuit is required.

For the reasons stated above, and for other reasons stated below which will become apparent to those skilled in the art upon reading and understanding the present specification, there is a need in the art for an integrated circuit which includes a temperature sensor which does not greatly effect the size or complexity of the integrated circuit.

SUMMARY OF THE INVENTION

The above mentioned problems with temperature detection and other problems are addressed by the present invention and which will be understood by reading and studying the following specification. An integrated circuit is described which samples a temperature sensitive circuit.

In particular, the present invention describes an integrated memory device comprising a temperature detection circuit for tracking a temperature of the integrated memory device and producing an output signal on an output node indicating a temperature range, and a control circuit coupled to the temperature detection circuit for receiving the output signal and adjusting an operation parameter of the integrated circuit memory device in response to the output signal.

An integrated circuit device is also described which comprises a temperature detection circuit for tracking a temperature of the integrated circuit device and producing a multiple-bit output signal indicating a temperature range. The device also comprises a status register latch circuit for storing the multiple-bit output signal, and a control circuit coupled to the temperature detection circuit and the status register latch circuit, the control circuit adapted to activate the temperature detection circuit and receive the multiple-bit output signal, and adapted to retrieve the multiple-bit output signal from the status register latch circuit.

In yet another embodiment, a method of operating an integrated circuit is described. The method comprises the steps of detecting a temperature range of the integrated circuit using an internal temperature detector, generating a signal representing the detected temperature range, and adjusting the operation of the integrated circuit in response to the detected temperature range.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

A temperature detector is described which can be provided on an integrated circuit to monitor the operating temperature and provide an output. The output can be used by the integrated circuit for any number of purposes. Alternatively, the output can be provided to external components, such as a microprocessor, for use thereby. One type of integrated circuit which is well suited to benefit from the temperature detector is an integrated memory device. The memory device can be any configuration, including but not limited to DRAM, SRAM, EEPROM, and Flash EPROM. Prior to describing the temperature detection circuit, a brief description is provided of a Flash memory which can incorporate the temperature detector.

Flash Memory

Figure 1A:
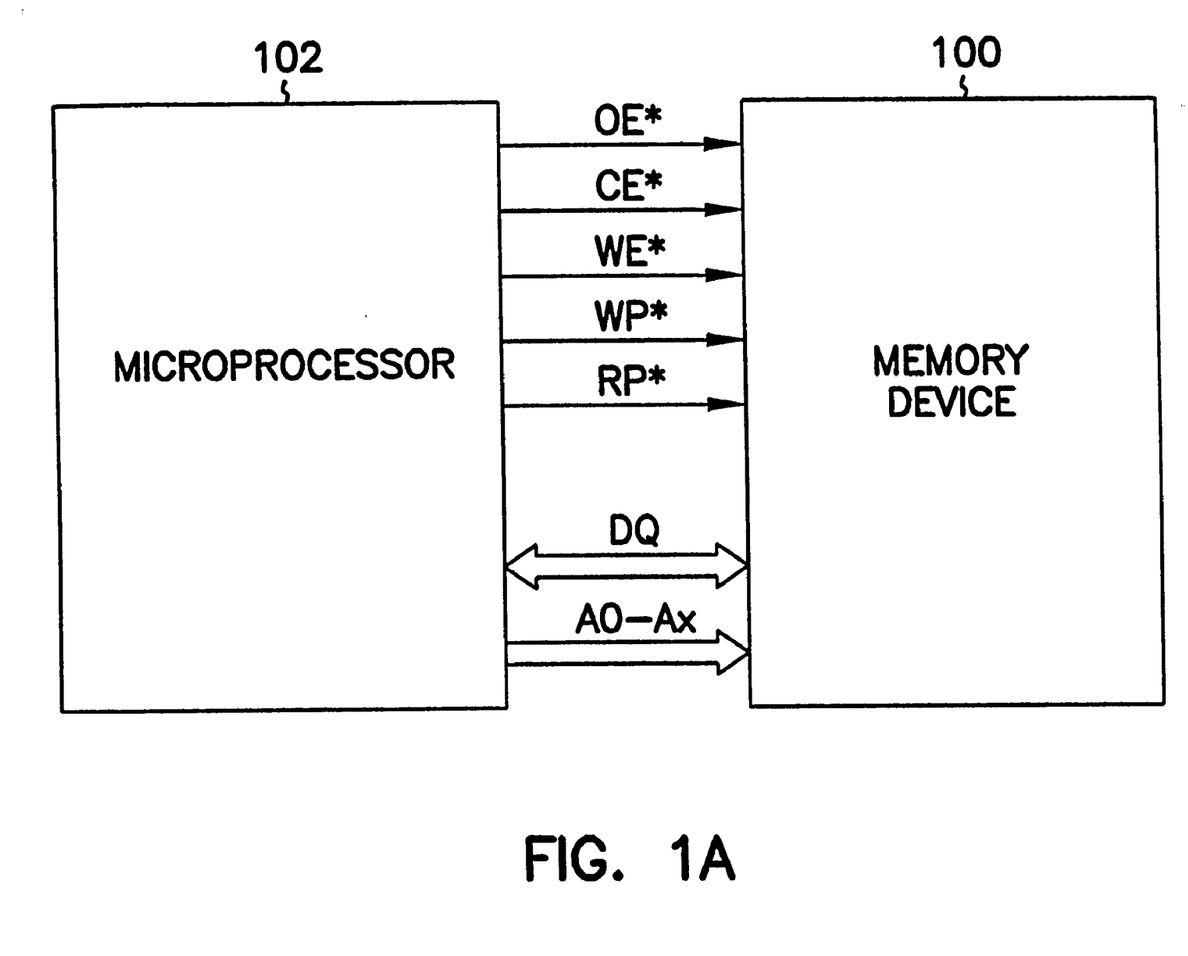
FIG. 1A is a block diagram of a flash memory system.

FIG. 1A illustrates a block diagram of a basic Flash memory device 100 which is coupled to a microprocessor, or memory controller 102. The memory device has been simplified to focus on features of the memory which are helpful in understanding the present invention. The memory device 100 includes an array of non-volatile memory cells 104, FIG. 1B. The memory cells are preferably floating gate memory cells. The array is arranged in rows and columns, with the rows arranged in blocks. The blocks allow memory cells to be erased in blocks. Data, however, is stored in the memory array separate from the block structure. Erase operations, therefore, are performed much faster.

Figure 1B:
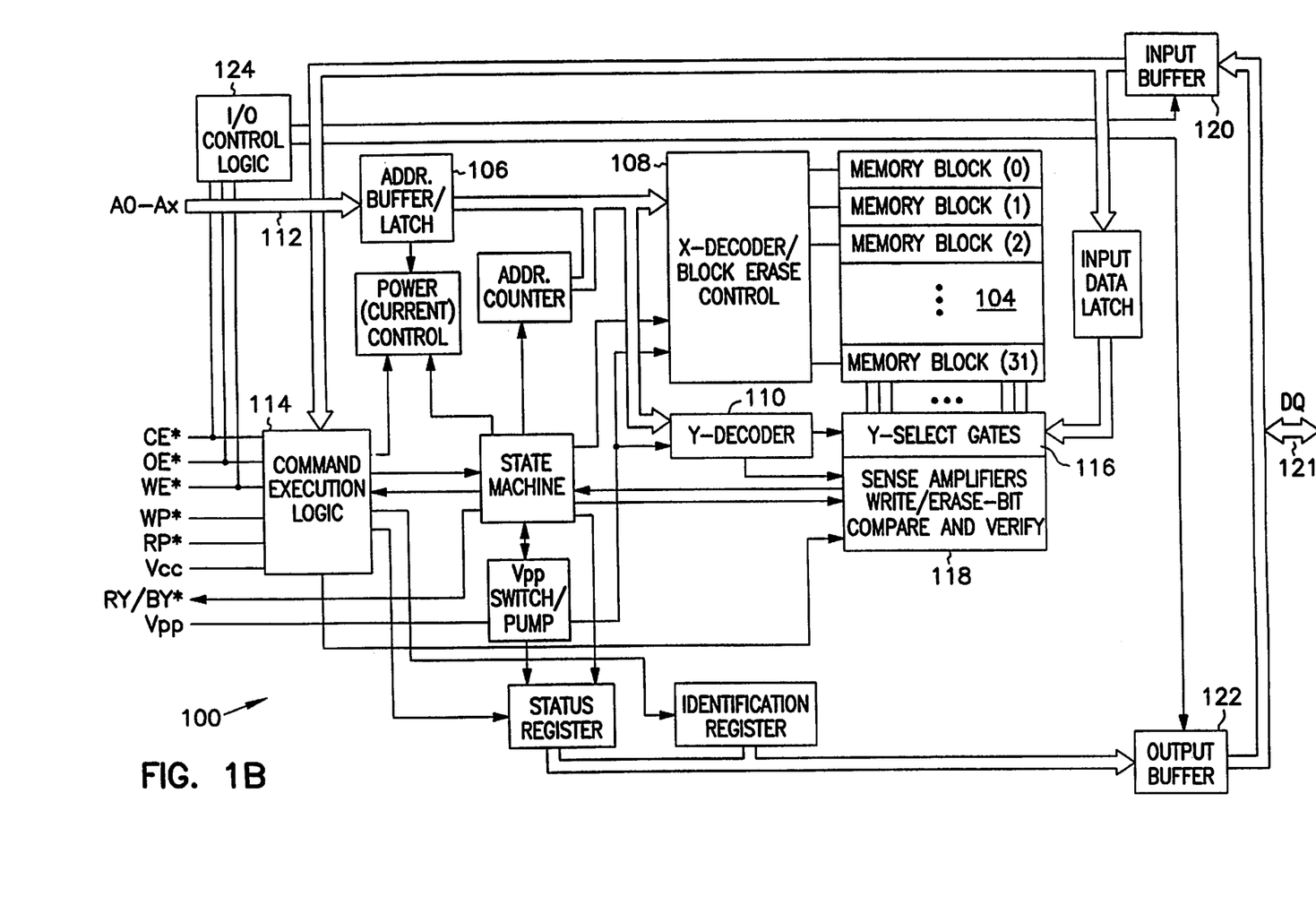
FIG. 1B is a detailed illustration of the flash memory of FIG. 1A.

An x-decoder 108 and a y-decoder 110 are provided to decode address signals provided on address lines A0–Ax 112. An address buffer circuit 106 is provided to latch the address signals. Address signals are received and decoded to access the memory array 104. A y-select circuit 116 is provided to select a column of the array identified with the y-decoder 110. Sense amplifier and compare circuitry 118 is used to sense data stored in the memory cells and verify the accuracy of stored data. Data input 120 and output 122 buffer circuits are included for bi-directional data communication over a plurality of data (DQ) lines with the microprocessor 102. Command control circuit 114 decodes signals provided on control lines from the microprocessor. These signals are used to control the operations of the memory, including data read, data write, and erase operations. Input/output control circuit 124 is used to control the input and output buffers in response to some of the control signals. The memory includes an internal circuitry in command control circuit 114 for generating timing signals. As stated above, the Flash memory of FIG. 1A has been simplified to facilitate a basic understanding of the features of the memory. A more detailed understanding of Flash memories is known to those skilled in the art. See "1997 Flash Memory Data Book" pages 2–5 to 2–33 available from Micron Quantum Devices, Inc. (incorporated herein by reference) for a more detailed description of a Flash memory.

Figure 1C:
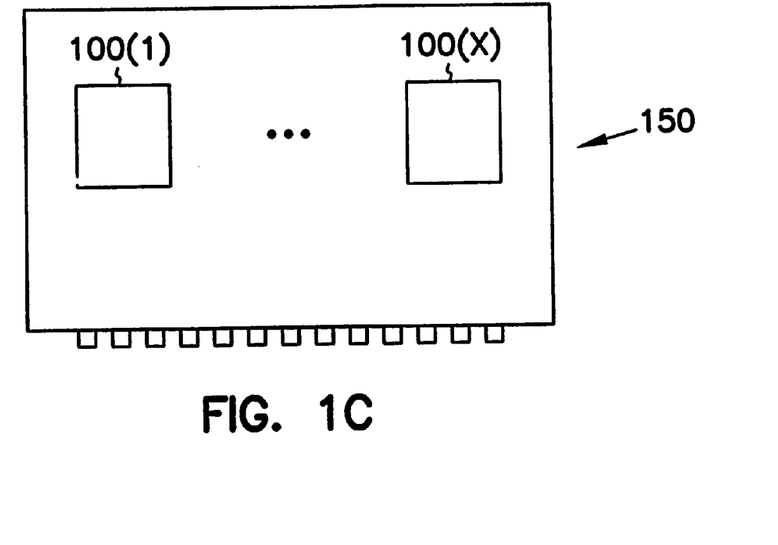
FIG. 1C is a diagram of a memory card including several flash memories of FIG. 1B.

It will be appreciated that more than one Flash memory can be included in various package configurations. For example, compact Flash memory cards 150 can be manufactured in varying densities using numerous Flash memories 100 (1)–100(x) as illustrated in FIG. 1C. See "1997 Flash Memory Data Book" pages 3–1 to 3–3 available from Micron Quantum Devices, Inc. (incorporated herein by reference) for a more detailed description of a Flash memory card.

Temperature Detector Circuit

Figure 2:
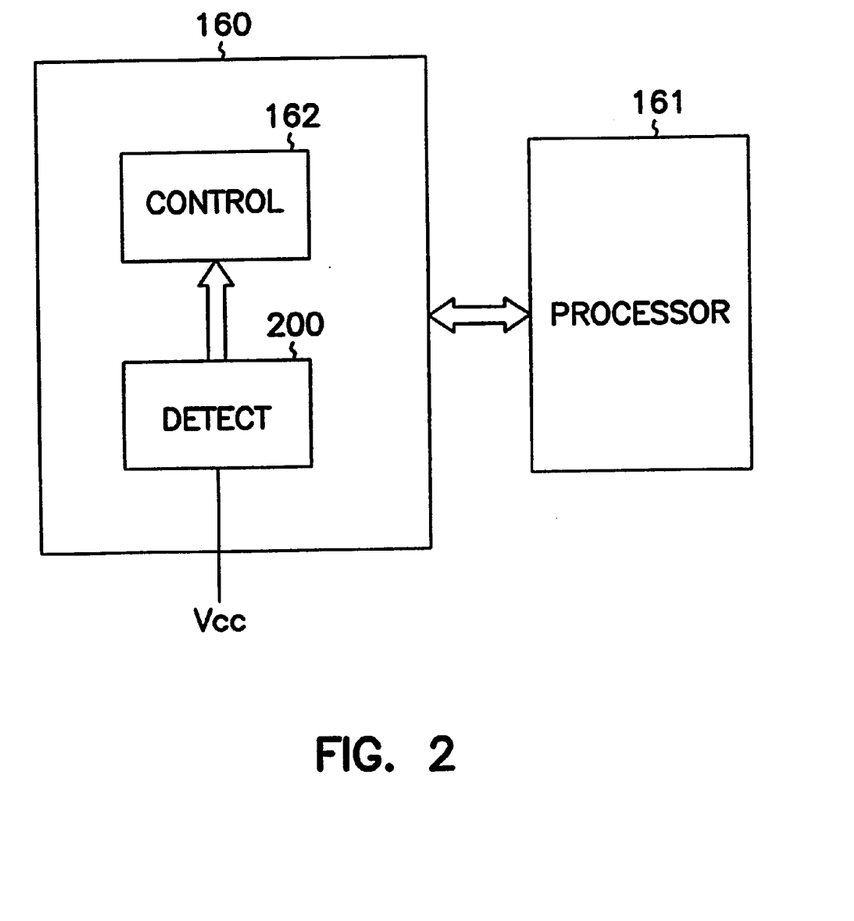
FIG. 2 is a block diagram of an integrated circuit incorporating a temperature detection circuit.

FIG. 2 is a block diagram of an integrated circuit 160 which includes a control circuit 162 for controlling the operation of the integrated circuit and a temperature detection circuit 200. The integrated circuit can be coupled to an external processor, or controller 161, referred to herein generally as a processor. In a preferred embodiment, the integrated circuit is a memory device, such as a flash memory. The control circuit 162 can receive output data from the temperature detector and determine the present range of the integrated circuit operating temperature. The control circuit can then adjust operating parameters of the integrated circuit in response to the detected temperature. The detection circuit 200 can be operational at all times that the integrated circuit is operational, or the detection circuit can be operational only in response to a sample request. If the detection circuit is sampled, the output can be stored in a latch for continued use by the integrated circuit when the detection circuit is inactive, see FIG. 3 described below.

Figure 3:
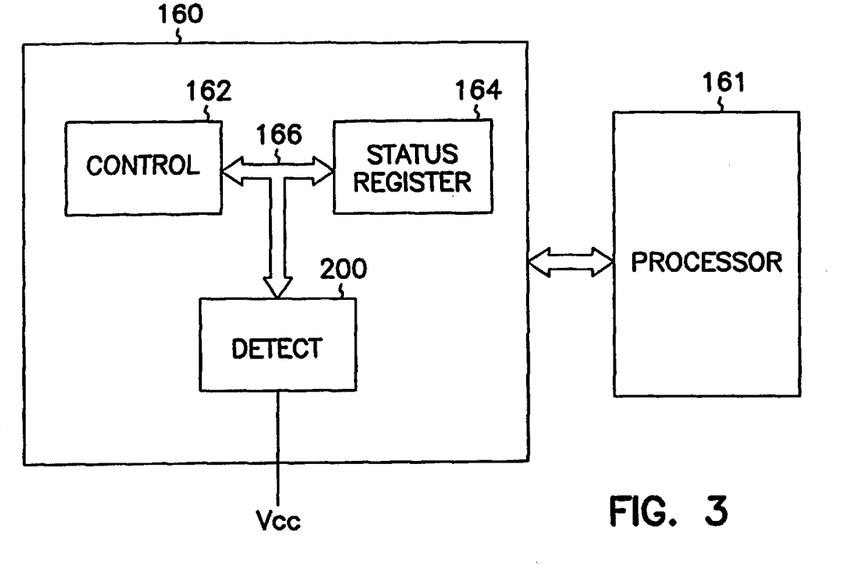
FIG. 3 is a block diagram of a system having a temperature detection circuit.

Referring to FIG. 3, a block diagram is provided of an integrated circuit 160 including control circuitry 162 for controlling the operation of the integrated circuit, a status register 164, and a temperature circuit 200. The integrated circuit is coupled to an external processor 161. Again, the integrated circuit can be a memory device, such as a flash memory. In operation, the temperature detector circuit samples the temperature and outputs a signal on bus 166. The output can then be stored, or latched, in status register 164. The status register can be either a volatile or non-volatile latch. The control circuit 162 can then retrieve the data stored in the status register to determine the current temperature range. For example, the temperature can be sampled before each program operation, and the sampled value can be used during the program operation to modify appropriate programming parameters.

Figure 4:
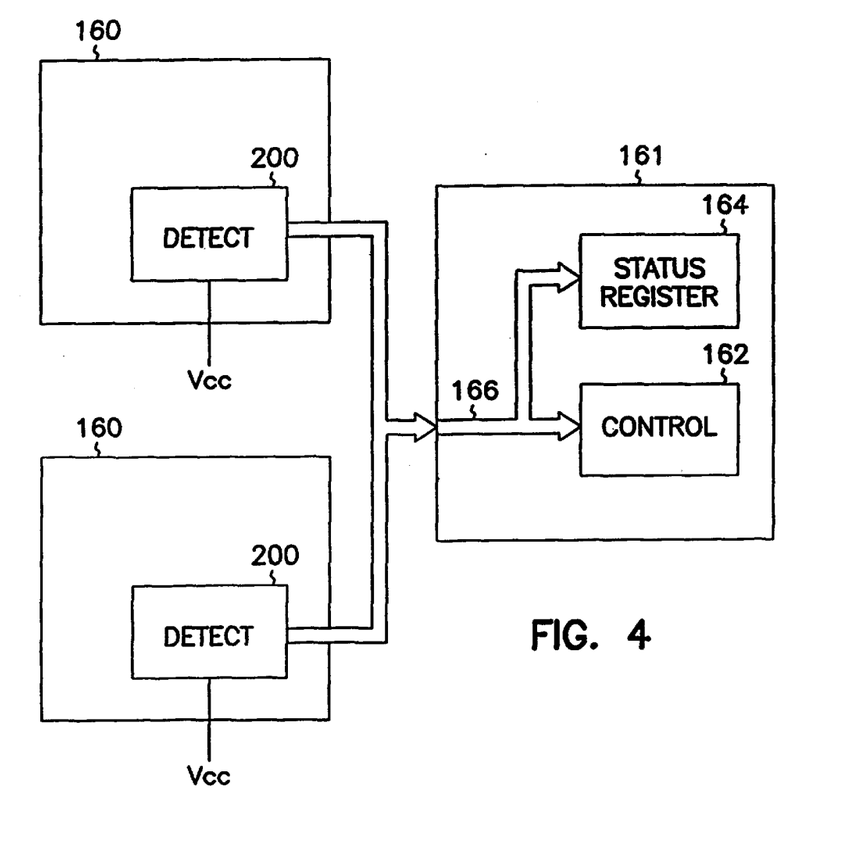
FIG. 4 is a block diagram of an alternate integrated circuit incorporating a temperature circuit.

FIG. 4 is a block diagram of an alternate system having multiple integrated circuits 161. Each circuit includes a temperature detector 200 which provides output signals to an external processor 161. The processor includes control circuitry 162 and a status register 164 to determine a present temperature level. This system allows one processor to monitor the temperature of several integrated circuits simultaneously. This is particularly applicable where the integrated circuits are physically located apart from each other and may be experiencing substantially different temperatures. It will be understood that in another embodiment, the control circuit 162 can be included in each integrated circuit 160, and only the status register stored in an external device.

It may be desired to use a look-up table for comparing output from the temperature detection circuit with recorded data to determine an operating temperature. The look-up table can be located in the integrated circuit 160, such as a portion of non-volatile memory, or it can be located externally. To produce the data initially stored in the look-up table, testing of the circuit under known conditions is conducted. For example, during electrical testing of the integrated circuit the temperature sensing circuitry can be read at 25° C. and 85° C. The temperature detector output for both readings is then stored in the look-up table.

During operation, the temperature detector output can be compared to the data in the look-up table. The result of the comparison gives an indication of the temperature of the integrated circuit with built-in sensing circuitry. For example, two different integrated circuits incorporating temperature sensing circuitry can be tested at 25° C. and 85°C. to produce four-bit outputs as shown in Table 1.

TABLE 1

|  | Output at 25° C. | Output at 85° C. |
| --- | --- | --- |
| Circuit 1 | 0011 | 0111 |
| Circuit 2 | 0001 | 0011 |

The difference between the outputs of Circuit 1 and Circuit 2 can be caused by variations in manufacturing processes. The controller can then compare outputs from the integrated circuits to data stored in the look-up table to determined an operating temperature. That is, if the controller reads 0011 from Circuit 1, the operating temperature would be around 25° C. Similarly, if the controller reads 0011 from Circuit 2, the operating temperature would be around 85° C. This method allows for the calibration of the temperature sensor, even if the manufacturing process has great variations. Although the described temperature detection circuits provide a digital output signal, it will be appreciated that an analog output signal could be provided from the temperature detection circuit to indicate the operating temperature.

Figure 5:
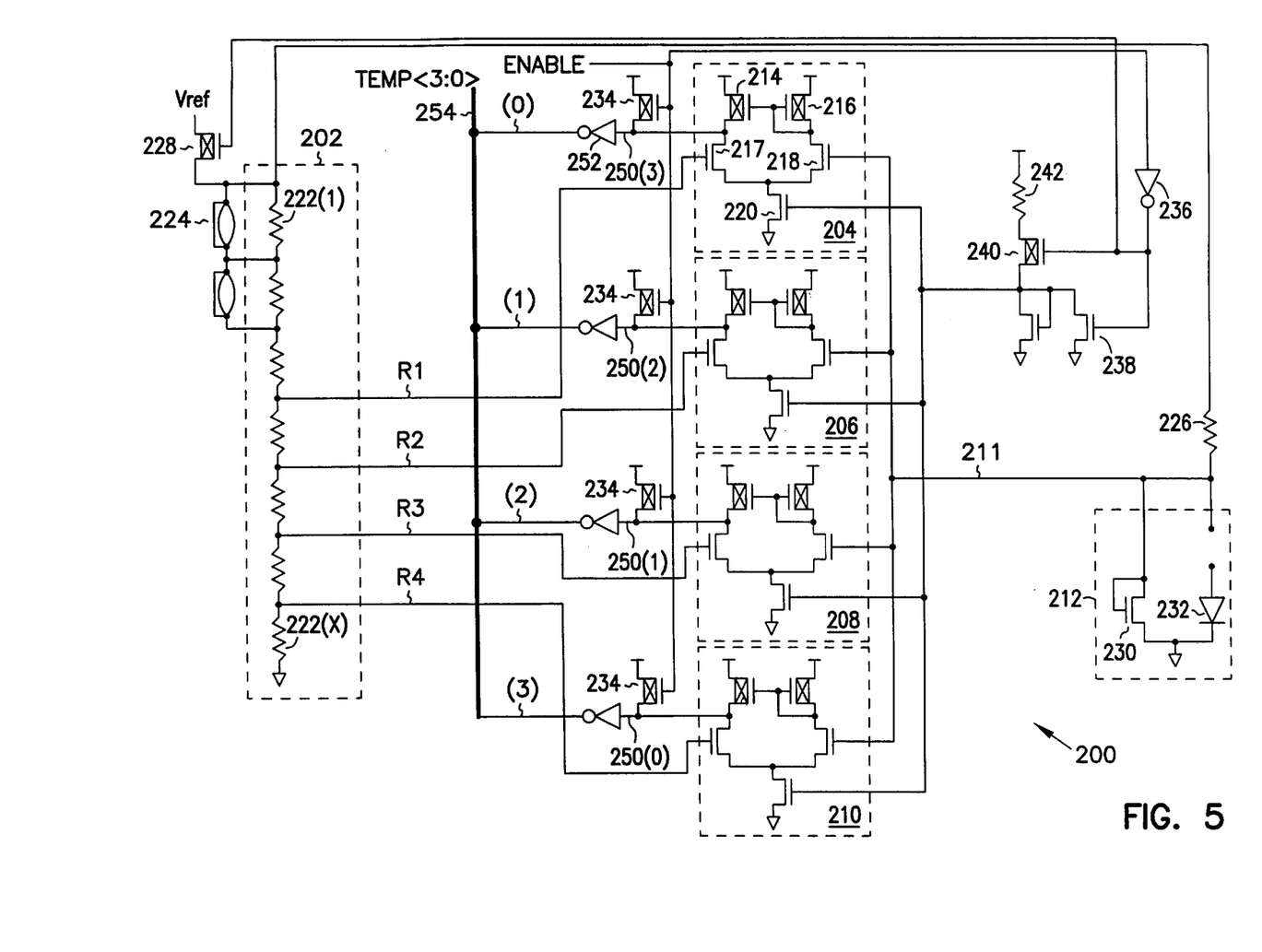
FIG. 5 is one embodiment of a temperature detection circuit.

Referring to FIG. 5, a four bit temperature detector circuit 200 is described. The temperature detector circuit 200 includes a voltage divider circuit 202, or resistor ladder, which provides reference voltages R1–R4. The resistors 222(1)–222(x) of the voltage divider are preferably fabricated as n-well resistors, but can be any type of integrated circuit resistors. Optional bypass conductors 224 can be provided in the resistor ladder to bypass a resistor for fine adjustments of the voltage divider. The bypass conductor can be either a maskable conductor, or fusible conductor.

The temperature detector includes four differential amplifiers 204, 206, 208 and 210 which are coupled to the voltage divider circuit. The differential amplifiers are also coupled to receive a temperature reference voltage, Tref, provided by sensing unit 212 on node 211. Enable circuitry is also included in the detector circuit for resetting the four bit output signal to zero and for minimizing power consumption, when Enable signal is low. It will be recognized by those skilled in the art that different comparator circuits can be used, and that the present detector should not be limited to the differential amplifier circuits illustrated.

Each of the differential amplifier circuits includes two p-channel transistors 214 and 216. Each differential amplifier circuit also includes n-channel transistors 217, 218 and 220. The gates of transistors 217 are coupled to the voltage divider to receive the reference voltages R1–R4. The gates of transistors 218 are coupled to node 211 to receive the temperature reference voltage, Tref Transistor 220 is provided to disable the differential amplifiers when an enable signal, Enable, transitions to a low logic state, as further explained below.

Sensing unit 212 includes a diode connected n-channel transistor 230 and/or a P-N junction diode 232 coupled to node 211. Node 211 is coupled to a reference voltage Vref via resistor 226 and p-channel transistor 228. Because the threshold voltage of transistor 230 and the forward biased voltage drop of diode 232 are temperature sensitive, as explained below, the sensing unit 212 varies the temperature reference voltage, Tref, on node 211 in response to changes in the operating temperature of the integrated circuit. It will be appreciated that either transistor 230 or diode 232 can be used. Other temperature sensitive devices can be substituted for transistor 230 or diode 232 with some appropriate modifications to detector 200 to accommodate the new device. In FIG. 5, diode 232 is illustrated as being disconnected from node 211. The diode junction drop will vary with temperature, and the threshold voltage of the transistor will also vary with temperature, in both cases, about–2 mV/C. The voltage at node 211, therefore, will decrease by 200 mV for a 100° C. temperature increase. For a given temperature, the voltage on node 211 will be, depending on a manufacturing process, somewhere between approximately 0.6 and 1.0 volts.

Enable circuitry is provided to disable the temperature detector and reset the four bit output signal on bus 254. The enable circuit includes p-channel transistors 234 connected to the differential amplifiers, inverter 236 and n-channel transistor 238. An Enable signal input is coupled to the gates of transistors 234 and the input of inverter 236. The Enable signal is normally in a high logic state so that transistors 234 and 238 are turned off. When Enable is in a high logic state, transistors 220 are turned on through active transistor 240. Further, transistor 228 is turned on as a result of a low logic level output of inverter 236.

In operation, with the Enable signal high, reference voltages R1–R4 are provided to the gates of transistors 217, and the gates of transistors 218 are coupled to voltage Tref. As the reference voltage Tref changes with changes in the temperature, the outputs 250(0)–250(3) of the differential amplifiers will change logic states. The outputs of the differential amplifiers are coupled to bus lines 254 through inverters 252 to provide a four bit output. In a preferred embodiment, the four bit output is used to indicate five different voltage ranges, as shown in Table 2.

TABLE 2

| Temp Range | Output (3) | Output (2) | Output (1) | Output (0) |
|---|---|---|---|---|
| Low | 0 | 0 | 0 | 0 |
| * | 0 | 0 | 0 | 1 |

TABLE 2-continued

| Temp Range | Output (3) | Output (2) | Output (1) | Output (0) |
|---|---|---|---|---|
| * | 0 | 0 | 1 | 1 |
| * | 0 | 1 | 1 | 1 |
| High | 1 | 1 | 1 | 1 |

It will be understood that a four bit output can provide sixteen different temperature ranges, however, the preferred five ranges, illustrated above, provide for simple circuitry without the need for encoding logic. These five ranges could also be encoded on 3 output bits with a simple combination of logic gates.

During operation, the outputs of the temperature detector circuit can be sampled directly, or through a latch, and either used by a control circuit 162 or compared with data in a look-up table by the control circuit 162 to determine the temperature range of the integrated circuit. If the integrated circuit is a memory device such as a flash memory, the status register can be stored in the integrated circuit memory array. The control can adjust operation of the memory based upon the temperature. For example, the timing of a programming pulse of a flash memory can be adjusted based upon the measured operating temperature. Thus the operation of the circuit can be adjusted as the temperature changes.

To reset the temperature detector circuit 200 prior to sampling the output of the temperature detector, the Enable signal transitions to a low logic state to turn off transistors 228 and 240. Transistors 220 are also turned off in response to the activation of transistor 238. Transistors 234 are activated to force nodes 250(0)–250(4) to a high logic state. The four bit output, therefore, of the temperature detector is 0000. Finally, it will be understood that additional differential amplifier circuits and steps in the resistor ladder can be added to increase the resolution of the temperature ranges.

Conclusion

An integrated circuit has been described which includes a temperature detection circuit. The detection circuit produces an output which indicates a temperature of the integrated circuit. The output of the detection circuit is used to adjust the operation of the integrated circuit. One embodiment of the integrated circuit has been described as a flash memory device which can include a controller to monitor the output of the detection circuit, or provide the output to a controller. The controller uses the detection circuit output to adjust memory operation, such as operating frequency. The output can be stored in a latch or used directly from the sensor. The output of the detection circuit preferably produces a multiple bit output which can be compared to a look-up table located within the integrated circuit. The look-up table can also be located outside the integrated circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated memory device comprising:
   a temperature detection circuit to detect a temperature of the integrated memory device and to generate a plurality of output signals indicating a temperature of the integrated memory device, the temperature detection circuit comprising:

a reference circuit to provide a plurality of reference voltages;

a temperature sensitive circuit to generate a signal determined by a temperature of the integrated memory device; and a plurality of comparator circuits, each comparator circuit being coupled to receive the signal of the temperature sensitive circuit and being coupled to receive a respective one of the reference voltages from the reference circuit to generate one of the output signals based on a comparison of the respective reference voltage with the signal of the temperature sensitive circuit; and a control circuit coupled to the temperature detection circuit to receive the output signals and to adjust an operation parameter of the integrated circuit memory device in response to the output signals.

2. The integrated memory device of claim 1 wherein the temperature sensitive circuit comprises a transistor having a threshold voltage that varies according to changes in the temperature of the integrated memory device.

3. The integrated memory device of claim 1 wherein the temperature sensitive circuit comprises a diode having a forward biased voltage drop that varies according to changes in the temperature of the integrated memory device.

4. The integrated memory device of claim 1, further comprising:

an array of floating-gate memory cells;

an inverter coupled to each comparator circuit wherein the output signal generated by each comparator circuit is inverted by the respective inverter to generate a digital data bit;

an enabling circuit including a first plurality of transistors to enable or disable the comparator circuits and a second plurality of transistors to reset the output signals when the comparator circuits are disabled;

a look-up table stored in a memory and having the temperature of the integrated memory device corresponding to each combination of output signals;

wherein each comparator circuit comprises a differential amplifier; and wherein the reference circuit comprises a voltage divider.

5. A temperature detection circuit comprising:

a reference circuit to provide a plurality of reference voltages;

a temperature sensitive circuit to generate a signal determined by a temperature of the temperature detection circuit; and a plurality of comparator circuits, each comparator circuit being coupled to receive the signal of the temperature sensitive circuit and being coupled to receive a respective one of the reference voltages from the reference circuit to generate an output signal based on a comparison of the respective reference voltage with the signal of the temperature sensitive circuit to indicate the temperature of the temperature detection circuit.

6. The temperature detection circuit of claim 5 wherein the temperature sensitive circuit comprises a transistor having a threshold voltage that varies according to changes in the temperature of the temperature detection circuit.

7. The temperature detection circuit of claim 5 wherein the temperature sensitive circuit comprises a diode having a forward biased voltage drop that varies according to changes in the temperature of the temperature detection circuit.

8. The temperature detection circuit of claim 5, further comprising:

an inverter coupled to each comparator circuit wherein the output signal generated by each comparator circuit is inverted by the respective inverter to generate a digital data bit;

an enabling circuit including a first plurality of transistors to enable or disable the comparator circuits and a second plurality of transistors to reset the output signals when the comparator circuits are disabled;

wherein each comparator circuit comprises a differential amplifier; and wherein the reference circuit comprises a voltage divider.

9. The temperature detection circuit of claim 5 wherein the temperature detection circuit is formed in an integrated circuit.

10. An integrated temperature detection circuit comprising:

a voltage divider to provide a plurality of reference voltages;

a temperature sensitive circuit to generate a signal determined by a temperature of the temperature detection circuit, the temperature sensitive circuit including an element having a voltage drop that is determined by the temperature of the temperature detection circuit;

a plurality of differential amplifiers, each differential amplifier being coupled to receive the signal of the temperature sensitive circuit and being coupled to receive a respective one of the reference voltages from the voltage divider to generate an output signal based on a comparison of the respective reference voltage with the signal of the temperature sensitive circuit to indicate the temperature of the temperature detection circuit;

an inverter coupled to each differential amplifier wherein the output signal generated by each differential amplifier is inverted by the respective inverter to generate a digital data bit; and an enabling circuit including a first plurality of transistors to enable or disable the differential amplifiers and a second plurality of transistors to reset the output signals when the comparator circuits are disabled.

11. The integrated temperature detection circuit of claim 10 wherein the element having a voltage drop comprises a transistor having a threshold voltage that varies according to changes in the temperature of the temperature detection circuit.

12. The integrated temperature detection circuit of claim 10 wherein the element having a voltage drop comprises a diode having a forward biased voltage drop that varies according to changes in the temperature of the temperature detection circuit.

13. A processing system comprising:

a processor;

an integrated circuit device coupled to the processor to exchange data and instructions with the processor, the integrated circuit device including a temperature detection circuit comprising:

a reference circuit to provide a plurality of reference voltages;

a temperature sensitive circuit to generate a signal determined by a temperature of the integrated circuit device; and a plurality of comparator circuits, each comparator circuit being coupled to receive the signal of the temperature sensitive circuit and being coupled to receive a respective one of the reference voltages from the reference circuit to generate an output signal based on a comparison of the respective reference voltage with the signal of the temperature sensitive circuit to indicate the temperature of the integrated circuit device; and a control circuit coupled to the temperature detection circuit in the integrated circuit device to receive the output signals and to control an operation of the integrated circuit device based on the instructions from the processor and to adjust operating parameters of the integrated circuit device in response to changes in the temperature of the integrated circuit device.

14. The processing system of claim 13 wherein the integrated circuit device further comprises:

a bus coupled between the temperature detection circuit and the control circuit; and a status register coupled to the bus to store the output signals from the temperature detection circuit and to provide the output signals to the control circuit over the bus.

15. The processing system of claim 13 wherein the temperature sensitive circuit comprises a transistor having a threshold voltage that varies according to changes in the temperature of the integrated circuit device.

16. The processing system of claim 13 wherein the temperature sensitive circuit comprises a diode having a forward biased voltage drop that varies according to changes in the temperature of the integrated circuit device.

17. The processing system of claim 13, further comprising:

an inverter coupled to each comparator circuit wherein the output signal generated by each comparator circuit is inverted by the respective inverter to generate a digital data bit;

an enabling circuit including a first plurality of transistors to enable or disable the comparator circuits and a second plurality of transistors to reset the output signals when the comparator circuits are disabled;

wherein each comparator circuit comprises a differential amplifier;

wherein the reference circuit comprises a voltage divider; and wherein the integrated circuit device comprises a memory device with an array of floating-gate memory cells.

18. A processing system comprising:

a processor;

a bus coupled to the processor; and an integrated circuit device coupled to the bus to exchange data and instruction signals with the processor, the integrated circuit device including a temperature detection circuit comprising:

a reference circuit to provide a plurality of reference voltages;

a temperature sensitive circuit to generate a signal determined by a temperature of the integrated circuit device; and a plurality of comparator circuits, each comparator circuit being coupled to receive the signal of the temperature sensitive circuit and being coupled to receive a respective one of the reference voltages from the reference circuit to generate an output signal based on a comparison of the respective reference voltage with the signal of the temperature sensitive circuit to indicate the temperature of the integrated circuit device;

wherein the temperature detection circuit is coupled to provide the output signals to the processor over the bus, the processor having elements or instructions to to adjust operating parameters of the integrated circuit device in response to changes in the temperature of the integrated circuit device.

19. The processing system of claim 18 wherein the temperature sensitive circuit comprises a transistor having a threshold voltage that varies according to changes in the temperature of the integrated circuit device.

20. The processing system of claim 18 wherein the temperature sensitive circuit comprises a diode having a forward biased voltage drop that varies according to changes in the temperature of the integrated circuit device.

21. The processing system of claim 18, further comprising:

an inverter coupled to each comparator circuit wherein the output signal generated by each comparator circuit is inverted by the respective inverter to generate a digital data bit;

an enabling circuit including a first plurality of transistors to enable or disable the comparator circuits and a second plurality of transistors to reset the output signals when the comparator circuits are disabled;

wherein each comparator circuit comprises a differential amplifier;

wherein the reference circuit comprises a voltage divider; and wherein the integrated circuit device comprises a memory device with an array of floating-gate memory cells.

22. A processing system comprising:

a processor;

a memory device; and a temperature detection circuit comprising:

a temperature sensitive circuit to generate a signal determined by a temperature of the temperature detection circuit; and means for processing the signal of the temperature sensitive circuit into a plurality of output signals indicating the temperature of the temperature detection circuit.

23. A temperature detection circuit comprising:

a temperature sensitive circuit to generate a signal determined by a temperature of the temperature detection circuit; and means for processing the signal of the temperature sensitive circuit into a plurality of output signals indicating the temperature of the temperature detection circuit.

24. The temperature detection circuit of claim 23 wherein the temperature sensitive circuit comprises a transistor having a threshold voltage that varies according to changes in the temperature of the temperature detection circuit.

25. The temperature detection circuit of claim 23 wherein the temperature sensitive circuit comprises a diode having a forward biased voltage drop that varies according to changes in the temperature of the temperature detection circuit.

26. A method for detecting a temperature of an integrated circuit comprising:

generating a temperature signal in a temperature sensitive circuit coupled to the integrated circuit, the temperature signal being determined by the temperature of the integrated circuit;

generating a plurality of reference signals;

comparing the temperature signal with each of the reference signals; and generating an output signal for each comparison to indicate the temperature of the integrated circuit.

27. The method of claim 26, further comprising determining the temperature of the integrated circuit to be within a range of temperatures based on the output signals.

28. The method of claim 26, further comprising determining the temperature of the integrated circuit by comparing the output signals with temperature data stored in a look-up table.

29. The method of claim 28, further comprising:

producing the temperature data by generating the output signals to indicate the temperature of the integrated circuit while it is subject to known temperatures; and recording the output signals and the known temperatures in the look-up table.

30. The method of claim 26 wherein generating a temperature signal comprises generating a temperature signal from a transistor having a threshold voltage determined by the temperature of the integrated circuit.

31. The method of claim 26 wherein generating a temperature signal comprises generating a temperature signal from a diode having a forward biased voltage drop determined by the temperature of the integrated circuit.

32. The method of claim 26, further comprising resetting the output signals.

33. A method for operating a processing system comprising:

exchanging a plurality of instructions and data between a processor and a memory device to store the data in the memory device and retrieve the data from the memory device;

generating a temperature signal in a temperature sensitive circuit in the memory device, the temperature signal being determined by a temperature of the memory device;

generating a plurality of reference signals;

comparing the temperature signal with each of the reference signals;

generating an output signal for each comparison to indicate the temperature of the memory device; and modifying one or more operating parameters of the memory device based on the output signals.

34. The method of claim 33, further comprising determining the temperature of the memory device to be within a range of temperatures based on the output signals.

35. The method of claim 33, further comprising determining the temperature of the memory device by comparing the output signals with temperature data stored in a look-up table.

36. The method of claim 33, further comprising:

producing the temperature data by generating the output signals to indicate the temperature of the memory device while it is subject to known temperatures; and recording the output signals and the known temperatures in the look-up table.

37. The method of claim 33 wherein generating a temperature signal comprises generating a temperature signal from a transistor having a threshold voltage determined by the temperature of the memory device.

38. The method of claim 33 wherein generating a temperature signal comprises generating a temperature signal from a diode having a forward biased voltage drop determined by the temperature of the memory device.

39. The method of claim 33, further comprising:

sampling the output signals; and storing the sampled output signals in a status register.

40. The method of claim 33, further comprising resetting the output signals.

41. The method of claim 33 wherein comparing comprises comparing the temperature signal with each reference signal in a differential amplifier.

42. A method comprising:

operating an integrated circuit device;

a step for detecting a temperature of the integrated circuit device; and modifying the operation of the integrated circuit device based on the detected temperature.

43. A method for detecting a temperature of an integrated circuit device comprising:

generating a temperature signal in a temperature sensitive circuit coupled to the integrated circuit device, the temperature signal being determined by the temperature of the integrated circuit device; and a step for processing the temperature signal into a plurality of output signals indicating the temperature of the integrated circuit device.

44. The method of claim 43 wherein generating a temperature signal comprises generating a temperature signal from a transistor having a threshold voltage determined by the temperature of the integrated circuit device.

45. The method of claim 43 wherein generating a temperature signal comprises generating a temperature signal from a diode having a forward biased voltage drop determined by the temperature of the integrated circuit device.

* * * * *

UNITED STATES PATENT AND TRADEMARK OFFICE
CERTIFICATE OF CORRECTION

PATENT NO. : 6,002,627
DATED : December 14, 1999
INVENTOR(S) : Christophe J. Chevallier It is certified that error appears in the above-identified patent and that said Letters Patent is hereby corrected as shown below:

Column 12, line 27, please delete "a step for detecting a temperature of the integrated circuit device, and" and insert --generating a temperature signal in a temperature sensitive circuit coupled to the integrated circuit device, the temperature signal being determined by a temperature of the integrated circuit device; a step for processing the temperature signal into a plurality of output signals indicating the temperature of the integrated circuit device; and-- before "modifying".

Column 12, line 31, please delete "detected" before "temperature".

Column 12, line 31, please insert --of the integrated circuit device-- after "temperature".

Signed and Sealed this

Twenty-sixth Day of December, 2000

Attest:

Q. TODD DICKINSON

*Attesting Officer*  *Director of Patents and Trademarks*